(12) United States Patent
Madeira et al.

(10) Patent No.: US 7,966,909 B2
(45) Date of Patent: Jun. 28, 2011

(54) PROCESS OF FORMING A RAZOR BLADE

(75) Inventors: John Madeira, Assonet, MA (US); Arutiun Papken Ehiasarian, Sheffield (GB); Papken Ehiasar Hovsepian, Sheffield (GB); Krassimir Grigorov Marchev, Sudbury, MA (US); Neville Sonnenberg, Newton, MA (US)

(73) Assignee: The Gillette Company, Boston, MA (US)

( * ) Notice: Subject to any disclaimer, the term of this patent is extended or adjusted under 35 U.S.C. 154(b) by 769 days.

(21) Appl. No.: 11/881,288

(22) Filed: Jul. 25, 2007

(65) Prior Publication Data

US 2009/0025512 A1     Jan. 29, 2009

(51) Int. Cl.
   *B21K 11/00*   (2006.01)
   *B26B 21/54*   (2006.01)

(52) U.S. Cl. .............. 76/104.1; 30/346.53; 30/346.54

(58) Field of Classification Search ............. 76/104.1, 76/DIG. 8; 30/50, 346.53, 346.54
   See application file for complete search history.

(56) References Cited

U.S. PATENT DOCUMENTS

| | | | |
|---|---|---|---|
| 3,743,551 A | 7/1973 | Sanderson | |
| 3,761,374 A * | 9/1973 | Bromer et al. | 204/192.11 |
| 3,774,703 A | 11/1973 | Sanderson | |
| 3,829,969 A * | 8/1974 | Fischbein et al. | 30/346.54 |
| 3,835,537 A * | 9/1974 | Sastri | 30/346.53 |
| 3,838,512 A | 10/1974 | Sanderson | |
| 3,911,579 A * | 10/1975 | Lane et al. | 30/346.54 |
| 4,556,607 A | 12/1985 | Sastri | |
| 5,142,785 A | 9/1992 | Grewal et al. | |
| 5,232,568 A | 8/1993 | Parent et al. | |
| 5,295,305 A | 3/1994 | Hahn et al. | |
| 5,630,275 A | 5/1997 | Wexler | |
| 5,669,144 A | 9/1997 | Hahn et al. | |
| 5,799,549 A | 9/1998 | Decker et al. | |
| 5,940,975 A | 8/1999 | Decker et al. | |
| 5,992,268 A | 11/1999 | Decker et al. | |
| 6,289,593 B1 | 9/2001 | Decker et al. | |

(Continued)

FOREIGN PATENT DOCUMENTS

GB      2 401 116      11/2004

(Continued)

OTHER PUBLICATIONS

PCT International Search Report with Written Opinion dated Apr. 6, 2009 (12 pgs).

(Continued)

*Primary Examiner* — Hwei-Siu C Payer
(74) *Attorney, Agent, or Firm* — Austin P. Wang; Kevin C. Johnson; Steven W. Miller

(57) ABSTRACT

The present invention relates to a process for forming a razor blade. The process includes the steps of: a) providing a substrate, b) forming a wedge-shaped sharpened edge on the substrate that has an included angle of less than thirty degrees and a tip radius of less than 1,000 angstroms, c) placing the substrate in a vacuum chamber, d) placing a first solid target in the vacuum chamber, e) providing a gas to be ionized in the vacuum chamber, and f) generating ions from the first solid target by applying a negative voltage to the first solid target in pulses, the ions forming a thin film coating on the wedge-shaped sharpened edge on the substrate.

19 Claims, 3 Drawing Sheets

U.S. PATENT DOCUMENTS

| | | | |
|---|---|---|---|
| 6,296,742 B1 | 10/2001 | Kouznetsov | |
| 6,330,750 B1 | 12/2001 | Meckel | |
| 6,503,373 B2 | 1/2003 | Eerden et al. | |
| 6,805,779 B2 | 10/2004 | Chistyakov | |
| 6,806,651 B1 | 10/2004 | Chistyakov | |
| 6,806,652 B1 | 10/2004 | Chistyakov | |
| 6,853,142 B2 | 2/2005 | Chistyakov | |
| 6,866,894 B2 | 3/2005 | Trankiem et al. | |
| 6,896,773 B2 | 5/2005 | Chistyakov | |
| 6,896,775 B2 | 5/2005 | Chistyakov | |
| 6,903,511 B2 | 6/2005 | Chistyakov | |
| 7,095,179 B2 | 8/2006 | Chistyakov | |
| 7,147,759 B2 | 12/2006 | Chistyakov | |
| 7,345,429 B2 | 3/2008 | Chistyakov | |
| 7,446,479 B2 | 11/2008 | Chistyakov | |
| 7,604,716 B2 | 10/2009 | Chistyakov | |
| 7,663,319 B2 | 2/2010 | Chistyakov et al. | |
| 7,750,575 B2 | 7/2010 | Chistyakov | |
| 7,808,184 B2 | 10/2010 | Chistyakov | |
| 7,811,421 B2 | 10/2010 | Chistyakov | |
| 2004/0060813 A1 | 4/2004 | Chistyakov | |
| 2004/0082187 A1 | 4/2004 | Chistyakov | |
| 2004/0085023 A1 | 5/2004 | Chistyakov | |
| 2004/0094411 A1 | 5/2004 | Chistyakov | |
| 2004/0182702 A1 | 9/2004 | Chistyakov | |
| 2004/0212311 A1 | 10/2004 | Chistyakov | |
| 2004/0212312 A1 | 10/2004 | Chistyakov | |
| 2004/0222745 A1 | 11/2004 | Chistyakov | |
| 2005/0006220 A1 | 1/2005 | Chistyakov | |
| 2005/0034666 A1 | 2/2005 | Chistyakov | |
| 2005/0103620 A1 | 5/2005 | Chistyakov | |
| 2005/0109607 A1 | 5/2005 | Ehiasarian et al. | |
| 2005/0167263 A1 | 8/2005 | Chistyakov | |
| 2005/0178654 A1 | 8/2005 | Chistyakov | |
| 2005/0184669 A1 | 8/2005 | Chistyakov | |
| 2005/0211543 A1 | 9/2005 | Chistyakov | |
| 2005/0252763 A1 | 11/2005 | Chistyakov | |
| 2006/0066248 A1 | 3/2006 | Chistyakov | |
| 2006/0175197 A1 | 8/2006 | Chistyakov | |
| 2006/0277767 A1 | 12/2006 | Sun et al. | |
| 2006/0279223 A1 | 12/2006 | Chistyakov | |
| 2007/0034497 A1 | 2/2007 | Chistyakov | |
| 2007/0119701 A1 | 5/2007 | Chistyakov | |
| 2007/0181417 A1 | 8/2007 | Chistyakov et al. | |
| 2007/0188104 A1 | 8/2007 | Chistyakov et al. | |
| 2008/0260478 A1* | 10/2008 | Hovsepian et al. | 407/119 |
| 2009/0032191 A1 | 2/2009 | Chistyakov | |
| 2009/0321249 A1 | 12/2009 | Chistyakov et al. | |
| 2010/0101935 A1 | 4/2010 | Chistyakov et al. | |
| 2010/0270144 A1 | 10/2010 | Chistyakov | |

FOREIGN PATENT DOCUMENTS

| | | |
|---|---|---|
| GB | 2 425 780 | 11/2006 |
| WO | WO 92/19425 | 11/1992 |
| WO | WO 2004/029322 | 4/2004 |
| WO | WO 2005/090632 | 9/2005 |
| WO | WO 2006/027016 A1 | 3/2006 |
| WO | WO 2006/079361 | 8/2006 |
| WO | WO 2007/009634 A1 | 1/2007 |

OTHER PUBLICATIONS

Helmersson, U., et al., "Ionized physical vapor deposition (IPVD): A review of technology and applications", Thin Solid Films 513 (2006) 1-24.

Ehiasarian, A.P., et al., "Interface microstructure engineering by high power impulse magnetron sputtering for the enhancement of adhesion", Journal of Applied Physics 101, 054301, pp. 1-10 (2007).

* cited by examiner

PROCESS OF FORMING A RAZOR BLADE

FIELD OF THE INVENTION

The present invention relates to improved razors and razor blades and to processes for producing razor blades or similar cutting tools with sharp and durable cutting edges.

BACKGROUND OF THE INVENTION

A razor blade typically is formed of suitable substrate material such as metal or ceramic. An edge is formed in the razor blade with a wedge-shape configuration having an ultimate edge or tip that has a radius of less than about 1000 angstroms, the wedge shaped surfaces having an included angle of less than 30°. As the shaving action is severe and blade edge damage frequently results, in order to enhance shavability, the use of one or more layers of supplemental coating material has been proposed for shave facilitation, and/or to increase the hardness, strength and/or corrosion resistance of the shaving edge. A number of such coating materials has been proposed, such as polymeric materials, metals and alloys, as well as other materials including diamond and diamond-like carbon material. Diamond and diamond-like carbon materials may be characterized as having substantial sp3 carbon bonding; a mass density greater than 2.5 grams/cm$^3$; and a Raman peak at about 133 cm$^{-1}$ (diamond) or about 1550 cm$^{-1}$ (diamond-like carbon). Each such layer or layers of supplemental material desirably provides characteristics such as improved shavability, improved hardness, edge strength and/or corrosion resistance while not adversely affecting the geometry and cutting effectiveness of the shaving edge. However, such proposals have not been satisfactory due to the tendency of the diamond or diamond-like coated edge to have poor adhesion to and to peel off from the wedge-shaped edge of the substrate.

SUMMARY OF THE INVENTION

The present invention is directed to a process for forming a razor blade. The process comprises the steps of:
a) providing a substrate;
b) forming a wedge-shaped sharpened edge on said substrate that has an included angle of less than thirty degrees and a tip radius of less than 1,000 angstroms;
c) placing said substrate in a vacuum chamber;
d) placing a first solid target in said vacuum chamber;
e) providing a gas to be ionized in said vacuum chamber; and
f) generating ions from said first solid target by applying a negative voltage to said first solid target in pulses, said ions forming a thin film coating on the wedge-shaped sharpened edge on the substrate.

The first solid target may be a metal, carbon or boron. The metal may be selected from the group consisting of Al, Nb, Zr, Cr, V, Ta, Ti, W, Ni, Hf, Si, Mo and an alloy comprising any combination of the elements of the group.

The process may comprise the additional step of g) generating additional ions from said first solid target by applying a second lower negative voltage to said first solid target in pulses, said ions forming a thin film coating on the wedge-shaped sharpened edge on the substrate.

The process may comprise the additional step of: g) pivoting said substrate about an axis during step f).

The process may comprise the additional steps of: g) placing a second solid target in said vacuum chamber and h) generating ions from said second solid target by applying a negative voltage to said second solid target in pulses, said ions forming a thin film coating on the wedge-shaped sharpened edge on the substrate. The second solid target may be placed in a different position relative to said substrate than said first solid target.

The pulses of step f) may be provided in such a way that a peak power density is developed in a pulse in the range of 0.1 kW/cm$^2$ to 20 kW/cm$^2$. The pulses of step f) may be provided at a pulse frequency in the range of 5 Hz to 10,000 Hz. The pulses of step f) may be generated to have a voltage in the range of −100 V to −10000 V. The pulses of step f) may be generated to have a duration in the range of 10 μs to 10000 μs. The pulses of step f) may be generated to have a current density on the target in the range of 0.1 to 10 A/cm$^2$.

The substrate may be biased in the range of −20 V to −1000 V. 14.

The gas may be selected from the group consisting of inert gas such as Ar, Ne, Kr, Xe and reactive gasses such as N$_2$, CH$_4$, C$_2$H$_2$, O$_2$ and all possible combinations including inert and reactive gasses. The gas may be at a pressure in the range of 1-10 millitorr.

BRIEF DESCRIPTION OF THE DRAWINGS

While the specification concludes with claims particularly pointing out and distinctly claiming the subject matter which is regarded as forming the present invention, it is believed that the invention will be better understood from the following description taken in conjunction with the accompanying drawings.

DETAILED DESCRIPTION OF THE INVENTION

Figure 1:
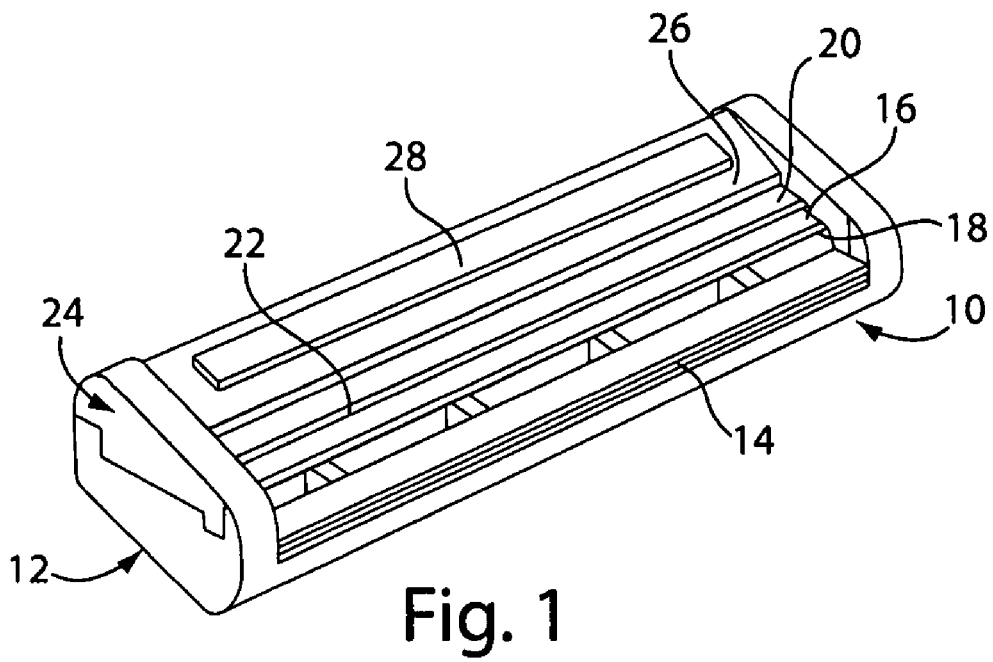
FIG. 1 is a perspective view of a shaving unit in accordance with the present invention.

With reference to FIG. 1, shaving unit 10 includes structure for attachment to a razor handle and a platform member 12 molded of high impact plastic that includes structure defining forward, transversely extending skin engaging surface 14. Mounted on platform member 12 are leading blade 16 having a sharpened edge 18 and following blade 20 having a sharpened edge 22. Cap member 24 of molded plastic has structure defining skin engaging surface 26 that is disposed rearwardly of blade edge 22, and affixed to cap member 24 is shaving aid composite 28.

Figure 2:
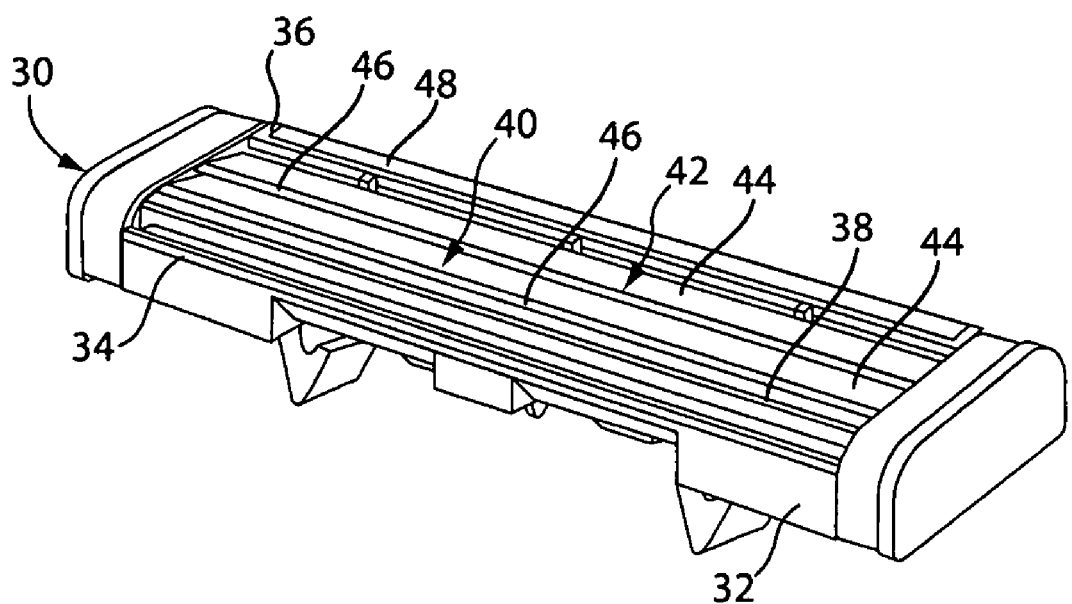
FIG. 2 is a perspective view of another shaving unit in accordance with the present invention.

The shaving unit 30 shown in FIG. 2 is of the type shown in Jacobson U.S. Pat. No. 4,586,255 and includes molded body 32 with front portion 34 and rear portion 36. Resiliently secured in body 32 are guard member 38, leading blade unit 40 and trailing blade unit 42. Each blade unit 40, 42 includes a blade member 44 that has a sharpened edge 46. A shaving aid composite 48 is frictionally secured in a recess in rear portion 36.

Figure 3:
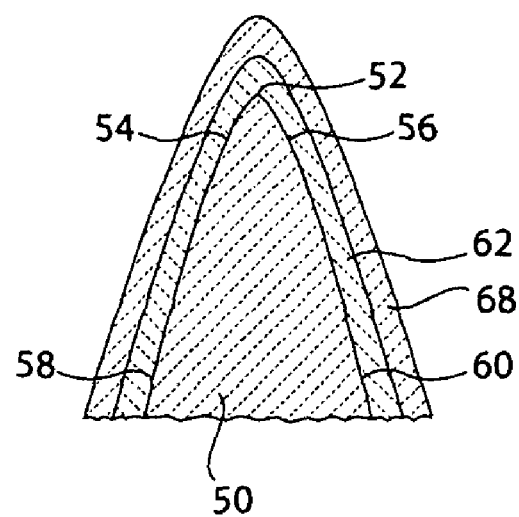
FIG. 3 is a diagrammatic view illustrating one example of razor blade edge geometry in accordance with the present invention.

A diagrammatic view of the edge region of the blades 16, 20 and 44 is shown in FIG. 3. The blade includes a stainless steel body portion 50 with a wedge-shaped sharpened edge formed in a sequence of edge forming operations that include a grinding operation, a rough honing operation, and a finish honing operation that forms a tip portion 52 that has a radius typically less than 1,000 angstroms with finish hone facets 54 and 56 that diverge at an angle of less than about 30° and merge with rough hone facets 58, 60. More preferably, the tip portion 52 has a radius of less than 750 angstroms and an includes angle of less than about 30° and most preferably, the tip portion 52 has a radius of less than 500 angstroms and an included angle of less than about 25°. Deposited on tip 52 and facets 54-60 is thin film layer or coating 62 of chromium nitride that has a thickness of less than about 3000 angstroms, more preferably less than about 2000 angstroms and most preferably less than about 1000 angstroms. Deposited on thin film layer 62 is an optional adherent telomer layer 68.

Figure 4:
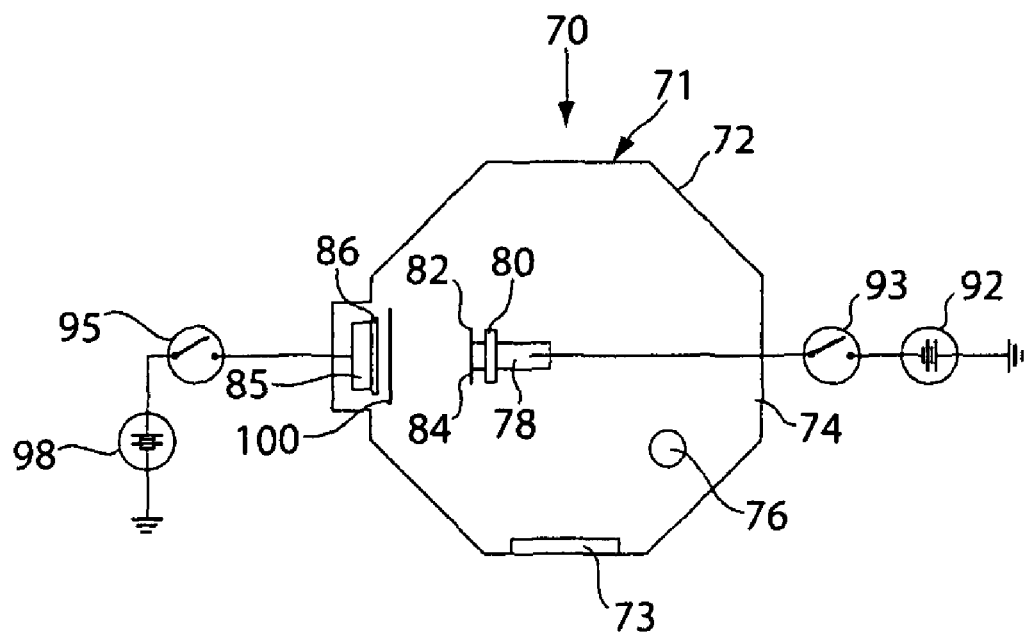
FIG. 4 is a diagrammatic view of an apparatus for carrying out the process of the present invention.

Apparatus 70 for processing blades of the type shown in FIG. 3 is diagrammatically illustrated in FIG. 4. Apparatus 70 includes a stainless steel vacuum chamber 71 with wall structure 72, door 73 and base structure 74 in which is formed port 76 coupled to a suitable vacuum pumping system (not shown). Mounted in vacuum chamber 71 is support 78 with upstanding support member 80 on which is disposed a stack of razor blades 82 with their sharpened edges 84 in alignment and facing outwardly from support member 80. Also disposed in vacuum chamber 71 is support structure 85 for target member 86 of chromium (Cr). Target 86 is a vertically disposed plate about twelve centimeters wide and about thirty-seven centimeters long. Support structures 78 and 85 are electrically isolated from vacuum chamber 71 and electrical connections are provided to connect blade stack 82 to a bias power supply 92 through switch 93 and target 86 connected through switch 95 to power supply 98. Shutter structure 100 is disposed adjacent target 86 for movement between an open position and a position obscuring its adjacent target.

Support member 80 supports the blade stack 82 with the blade edges 84 spaced about seven centimeters from the opposed target 86. Support member 80 may be pivotable about an axis such that sharpened blade edge may be positioned at differing angles with respect to target member 86.

In a particular processing sequence, a stack of blades 82 (thirty centimeters high) is secured to support member 80. Vacuum chamber 71 is evacuated. Target 86 is cleaned by high power impulse magnetron sputtering (HIPIMS) for five minutes. HIPIMS is a short pulse (impulse) sputtering method utilizing high powers. Cleaning of target 86 is carried out in an argon environment at a pressure of 3 millitorr. Switch 95 is opened, power is supplied by power source 98 at a voltage of −1200V, a current of 1600 A and a peak power of 1.6 kW/cm$^2$ increased gradually during the process. Pulse frequency is set at 100 Hz, with a pulse duration of 40 μs.

The cleaning of target 86 may be carried out at other settings such as at a pressure in the range of 1 to 5 millitorr, a voltage in the range of −500 V to −2500 V, a current in the range of 500 A to 2500 A, a peak power in the range of 0.1 kW/cm$^2$ to 20.0 kW/cm$^2$, a pulse frequency in the range of 50 Hz to 200 Hz, and a pulse duration in the range of 10 μs to 500 μs.

Blades 82 are then pre-treated or ion etched in an argon environment at a pressure of 1 millitorr for 5 minutes. Shutter 100 is in open position. Power is supplied to target 86 by power source 98 at a voltage of −1000 V, a pulse current of 1500 A and a peak power of 1.25 kW/cm$^2$ increased gradually during the process. Pulse frequency is set at 105 Hz, with a pulse duration of 50 μs. The blades are biased by power supplied from power source 92 to a high voltage that may be ramped from a low value up to the range of −500 V to −1000 V and an average current of 2.5 A. Shutter 100 remains opened. In these conditions the ion current density to the blades is 0.2 Acm$^{-2}$ in the peak. A substantial portion of the sputtered metal flux is ionized with metal ion fractions reaching 30%. A significant fraction of metal ions are doubly-ionized. Under these conditions high-energy metal ion bombardment of the blade edges occurs. The ion bombardment has the effect of incorporation of the etching metal, i.e., chromium, into the blade edge to depths of about 30 nm. Such incorporation leads to better adhesion of the coating to the blade edge via a mechanism of epitaxial coating growth localized on individual grains of the blade edge. Switches 93 and 95 are then closed at the end of the ion etching cycle.

The ion etching may be carried out at other settings such as at a pressure in the range of 0.5 to 5 millitorr for 1-10 minutes. Power may be supplied to target 86 by power source 98 at a voltage in the range of −500 V to −3000 V, a current in the range of 500 A to 3000 A, a peak power in the range of 0.1 to 20 kW/cm$^2$, a pulse frequency in the range of 50 to 300 Hz, and pulse duration in the range of 1 to 1000 μs. The blades may be biased by power supplied from power source 92 to a high voltage that may be ramped from a low value up to the range of −500 V to −1000 V and a current in the range of 1.0 to 2.5 A. The peak ion current density to the blades may be from 0.01 to 0.5 Acm$^{-2}$.

Blades 82 are then coated with a thin film coating of CrN in an argon and nitrogen environment. After the substrate cleaning cycle, the shutter remains opened, 200 sccm of nitrogen gas and 150 sccm of argon gas starts flowing into chamber 71, the cathode power and bias voltage are switched on at the same time. Argon is at a partial pressure of 2 millitorr and nitrogen is at a partial pressure of 1 millitorr. Shutter 100 in front of chromium target 86 is in a open position. Power is supplied to chromium target 86 by power source 98 at a voltage of −700 V, a current of 700 A and a peak power of 0.5 MW constant during the process. Pulse frequency is set at 200 Hz, with a pulse duration of 100 μs. The blades are biased by power supplied from power source 92 to a high voltage in the range of −50 V to −1000 V and an average current of 1 A. In these conditions the peak ion current density to the blades is 0.4 Acm$^{-2}$. A substantial portion of the ion flux is ionized with metal ion fractions reaching 15%. A significant fraction of metal ions are doubly-ionized and significant fraction of nitrogen molecules are dissociated. Under these conditions high-energy metal ion bombardment of the blade edges occurs. The ion bombardment coats the metal onto the blade edge. The thickness of the metal coating on the blade edge may be from 50 to 5000 angstroms.

The blade coating may be carried out at other settings such as 25 to 500 sccm of nitrogen gas, 25 to 500 sccm of argon gas, argon pressure in the range of 1 to 10 millitorr, nitrogen pressure in the range of 1 to 10 millitorr. Power may be supplied to chromium target 86 by power source 98 at a voltage in the range of −100 V to −10000 V, a current in the range of 100 A to 5000 A, and a peak power in the range of 0.1 to 20 kW/cm$^2$, pulse frequency in the range of 5 to 10000 Hz, and a pulse duration in the range of 10 to 10000 μs. The blades may be biased by power supplied from power source 92 to a high voltage in the range of −20 V to −1000 V and a current in the range of 0.1 A to 10 A. The ion current density to the blades may be in the range of 0.01 to 0.5 Acm$^{-2}$ in the peak.

The target member 86 may be comprised of metal, carbon or boron. Metals for the target member 86 may be selected from the group consisting of Al, Nb, Zr, Cr, V, Ta, Ti, W, Ni, Hf, Si, Mo, and an alloy comprising any combination of elements of the group.

An optional coating of polytetraflouroethylene (PTFE) telomer may be applied to the CrN coated edges of the blades in accordance with the teaching of U.S. Pat. No. 3,518,110.

The process involves heating the blades in a neutral atmosphere of argon and providing on the cutting edges of the blades an adherent and friction reducing polymer coating of solid PTFE. The telomer coating may have a thickness in the range of 100 to 2000 angstroms.

Figure 5:
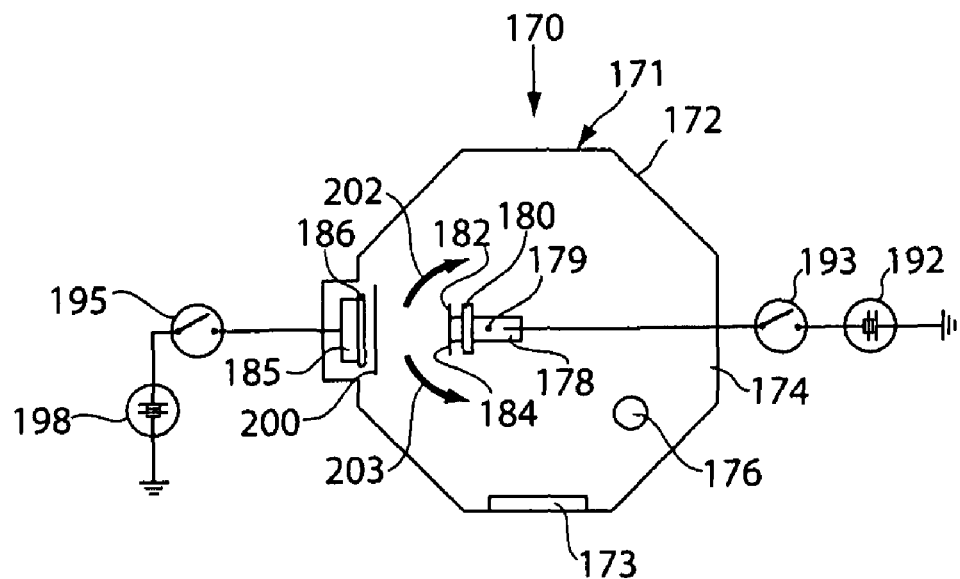
FIG. 5 is a diagrammatic view of an alternative apparatus for carrying out the process of the present invention.

Referring now to FIG. 5 there is shown an alternative apparatus 170 for processing blades of the type shown in FIG. 3. Apparatus 170 includes a stainless steel vacuum chamber 171 with wall structure 172, door 173 and base structure 174 in which is formed port 176 coupled to a suitable vacuum system (not shown). Mounted in vacuum chamber 171 is support 178 with upstanding support member 180 on which is disposed a stack of razor blades 182 with their sharpened edges 184 facing outwardly from support member 180. Also disposed in vacuum chamber 171 is support structure 185 for target member 186. Target 186 is a vertically disposed plate about twelve centimeters wide and about thirty-seven centimeters long. Support structures 178 and 185 are electrically isolated from vacuum chamber 171 and electrical connections are provided to connect blade stack 182 to a bias power supply 192 through switch 193 and target 186 connected through switch 195 to power supply 198. Shutter structure 200 is disposed adjacent target 186 for movement between an open position and a position obscuring its adjacent target.

Support member 180 supports the blade stack 182 with the blade edges 184 spaced about seven centimeters from the opposed target 186. Support member 180 is pivotable about pivot axis 179 such that sharpened blade edge can be positioned at differing angles with respect to target member 186. Arrows 202 and 203 indicate the direction of pivotal movement of support member 180 carrying blade stack 182 with blade edges 184 about pivot axis 179. By pivoting the blade edges 184 about pivot axis 179 multiple facets of the wedge-shaped sharpened edge can be coated with a thin film coating of CrN. The pivoting may take place in one or both of the ion etching or thin film coating operations.

Figure 6:
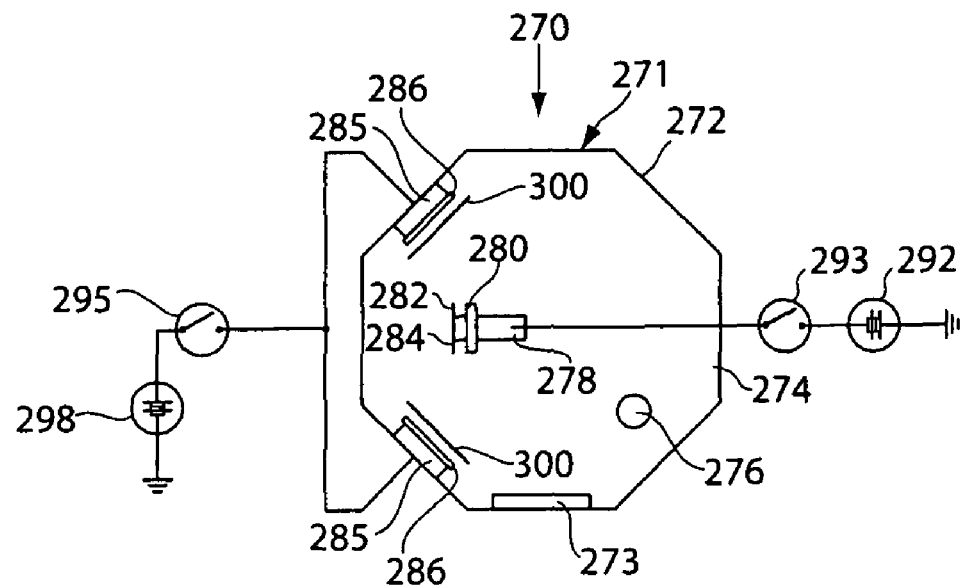
FIG. 6 is a diagrammatic view of another alternative apparatus for carrying out the process of the present invention.

Referring now to FIG. 6 there is shown an alternative apparatus 270 for processing blades of the type shown in FIG. 3. Apparatus 270 includes a stainless steel vacuum chamber 271 with wall structure 272, door 273 and base structure 274 in which is formed port 276 coupled to a suitable vacuum system (not shown). Mounted in vacuum chamber 271 is support 278 with upstanding support member 280 on which is disposed a stack of razor blades 282 with their sharpened edges 284 facing outwardly from support member 280. Also disposed in vacuum chamber 271 are two support structures 285 for target members 286. Each target 286 is a vertically disposed plate about twelve centimeters wide and about thirty-seven centimeters long. Support structures 278 and 285 are electrically isolated from vacuum chamber 271 and electrical connections are provided to connect blade stack 282 to a bias power supply 292 through switch 293 and targets 286 connected through switch 295 to power supply 298. Shutter structures 300 are disposed adjacent each target 286 for movement between an open position and a position obscuring its adjacent target.

Each target 286 is placed in different positions within chamber 271 relative to blade stack 282 so as to be at different angles with respect to the facets of the wedge-shaped sharpened edge. Both targets are utilized in both the ion etching and thin film coating operations.

The dimensions and values disclosed herein are not to be understood as being strictly limited to the exact numerical values recited. Instead, unless otherwise specified, each such dimension is intended to mean both the recited value and a functionally equivalent range surrounding that value. For example, a dimension disclosed as "40 mm" is intended to mean "about 40 mm."

All documents cited in the Detailed Description of the Invention are, in relevant part, incorporated herein by reference; the citation of any document is not to be construed as an admission that it is prior art with respect to the present invention. To the extent that any meaning or definition of a term in this document conflicts with any meaning or definition of the same term in a document incorporated by reference, the meaning or definition assigned to that term in this document shall govern.

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. A process for forming a razor blade comprising the steps of:
   a) providing a substrate;
   b) forming a wedge-shaped sharpened edge on said substrate that has an included angle of less than thirty degrees and a tip radius of less than 1,000 angstroms;
   c) placing said substrate in a vacuum chamber;
   d) placing a first solid target in said vacuum chamber;
   e) providing a gas to be ionized in said vacuum chamber; and
   f) generating ions from said first solid target by applying a negative voltage to said first solid target in pulses such that said ions from said first solid target has an ion fraction reaching about 15%, said ions forming a thin film coating on the wedge-shaped sharpened edge on the substrate.

2. The process of claim 1 wherein said first solid target is a metal, carbon or boron.

3. The process of claim 2 wherein said metal is selected from the group consisting of Al, Nb, Zr, Cr, V, Ta, Ti, W, Ni, Hf, Si, Mo and an alloy comprising any combination of elements of the group.

4. The process of claim 1 further comprising the step of:
   g) generating additional ions from said first solid target by applying a second lower negative voltage to said first solid target in pulses, said ions forming a thin film coating on the wedge-shaped sharpened edge on the substrate.

5. The process of claim 1 further comprising the step of:
   g) pivoting said substrate about an axis during step f).

6. The process of claim 1 further comprising the steps of:
   g) placing a second solid target in said vacuum chamber
   h) generating ions from said second solid target by applying a negative voltage to said second solid target in pulses, said ions forming a thin film coating on the wedge-shaped sharpened edge on the substrate.

7. The process of claim 6 wherein said second solid target is placed in a different position relative to said substrate than said first solid target.

8. The process of claim 1 wherein the pulses of step f) are provided in such a way that a power density is developed in a pulse in the range of 0.1 kW/cm$^2$ to 20 kW/cm$^2$.

9. The process of claim 1 wherein the pulses of step f) are provided at a pulse frequency in the range of 5 Hz to 10000 Hz.

10. The process of claim 1 wherein the pulses of step f) are generated to have a voltage in the range of −100 V to −10000 V.

11. The process of claim 1 wherein the pulses of step f) are generated to have a duration in the range of 10 μs to 10000 μs.

12. The process of claim 1 wherein the pulses of step f) are generated to have a current density on the target in the range of 0.01 to 0.5 A/cm$^2$ in the peak.

13. The process of claim 1 wherein the substrate is biased in the range of −20 V to −1000 V.

14. The process of claim 1 wherein the gas is an inert gas.

15. The process of claim 1 wherein the gas is a reactive gas.

16. The process of claim 1 wherein the gas is selected from the group consisting of Ar, Ne, Kr, Xe, $N_2$, $CR_4$, $C_2H_2$, $O_2$ and all combinations thereof.

17. The process of claim 1 wherein the gas is at a pressure in the range of 1 to 10 millitorr.

18. The process of claim 1 wherein said ion fraction reaches about 30%.

19. The process of claim 1 wherein a portion of said ions of said first solid target are doubly-ionized.

* * * * *

UNITED STATES PATENT AND TRADEMARK OFFICE
CERTIFICATE OF CORRECTION

PATENT NO. : 7,966,909 B2  
APPLICATION NO. : 11/881288  
DATED : June 28, 2011  
INVENTOR(S) : John Madeira et al.

Page 1 of 1

It is certified that error appears in the above-identified patent and that said Letters Patent is hereby corrected as shown below:

Column 8

Line 2, delete "$CR_4$" and insert --$CH_4$--

Signed and Sealed this

Sixteenth Day of August, 2011

David J. Kappos  
*Director of the United States Patent and Trademark Office*